US009383790B2

(12) United States Patent
Rosenzweig et al.

(10) Patent No.: US 9,383,790 B2
(45) Date of Patent: Jul. 5, 2016

(54) INTERNAL COMMUNICATION INTERCONNECT SCALABILITY

(71) Applicants: Nir Rosenzweig, Givat Ella (IL); Evgeny Bolotin, Haifa (IL); Guy Satat, Zichron Yakov (IL); Hisham Abu Salah, Majdal shams (IL)

(72) Inventors: Nir Rosenzweig, Givat Ella (IL); Evgeny Bolotin, Haifa (IL); Guy Satat, Zichron Yakov (IL); Hisham Abu Salah, Majdal shams (IL)

(73) Assignee: Intel Corporation, Santa Clara, CA (US)

( * ) Notice: Subject to any disclaimer, the term of this patent is extended or adjusted under 35 U.S.C. 154(b) by 475 days.

(21) Appl. No.: 13/793,684

(22) Filed: Mar. 11, 2013

(65) Prior Publication Data

US 2014/0258740 A1    Sep. 11, 2014

(51) Int. Cl.
  *G06F 1/26* (2006.01)
  *G06F 9/38* (2006.01)
  *G06F 1/32* (2006.01)
  *H03K 3/03* (2006.01)

(52) U.S. Cl.
  CPC ...... *G06F 1/26* (2013.01); *G06F 1/324* (2013.01); *G06F 9/38* (2013.01); *H03K 3/0315* (2013.01); *Y02B 60/1217* (2013.01)

(58) Field of Classification Search
  CPC ............... G06F 1/00; G06F 1/04; G06F 1/12; G06F 1/26; G06F 1/32; G06F 11/30; G06F 15/16
  See application file for complete search history.

(56) References Cited

U.S. PATENT DOCUMENTS

| 2009/0119302 | A1* | 5/2009 | Palmer | G06F 17/30368 |
| 2012/0170767 | A1* | 7/2012 | Astrom | H04M 1/2535 381/77 |
| 2013/0159741 | A1* | 6/2013 | Schluessler | G06F 1/3253 713/320 |
| 2013/0304954 | A1* | 11/2013 | Decesaris | G06F 13/38 710/110 |
| 2014/0068290 | A1* | 3/2014 | Bhandaru | G06F 1/26 713/320 |

* cited by examiner

*Primary Examiner* — Thomas Lee
*Assistant Examiner* — Mohammad A Rahman
(74) *Attorney, Agent, or Firm* — Lowenstein Sandler LLP

(57) ABSTRACT

Interconnect frequency control technologies of adjusting an operating frequency of a communication interconnect between an integrated circuit comprising multiple functional hardware units are described. A power management unit (PMU) is configured to collect workload data from the functional hardware units and determine a workload metric from the workload data. The PMU adjusts an operating frequency of the communication interconnect in view of the workload metric.

28 Claims, 10 Drawing Sheets

INTERNAL COMMUNICATION INTERCONNECT SCALABILITY

Embodiments described herein generally relate to processing devices and, more specifically, relate to internal communication interconnect scalability.

BACKGROUND

Modern processors include multiple instances of processor cores that can be turned on or off independently as directed by a Power Management Unit (PMU). A multi-core processor, for example, is a single computing component with two or more independent actual central processing units (also referred to as "logical processor," "cores" or "processor cores"), which are the units that read and execute program instructions. The instructions are typically CPU instructions, but multiple cores can run multiple instructions at the same time, increasing overall speed for programs amenable to parallel computing. Manufacturers typically integrate the cores onto an integrated circuit die, or onto multiple dies in a single package. Homogenous multi-core systems include only identical cores, and heterogeneous multi-core systems have cores that are not identical.

DESCRIPTION OF EMBODIMENTS

Figure 1:
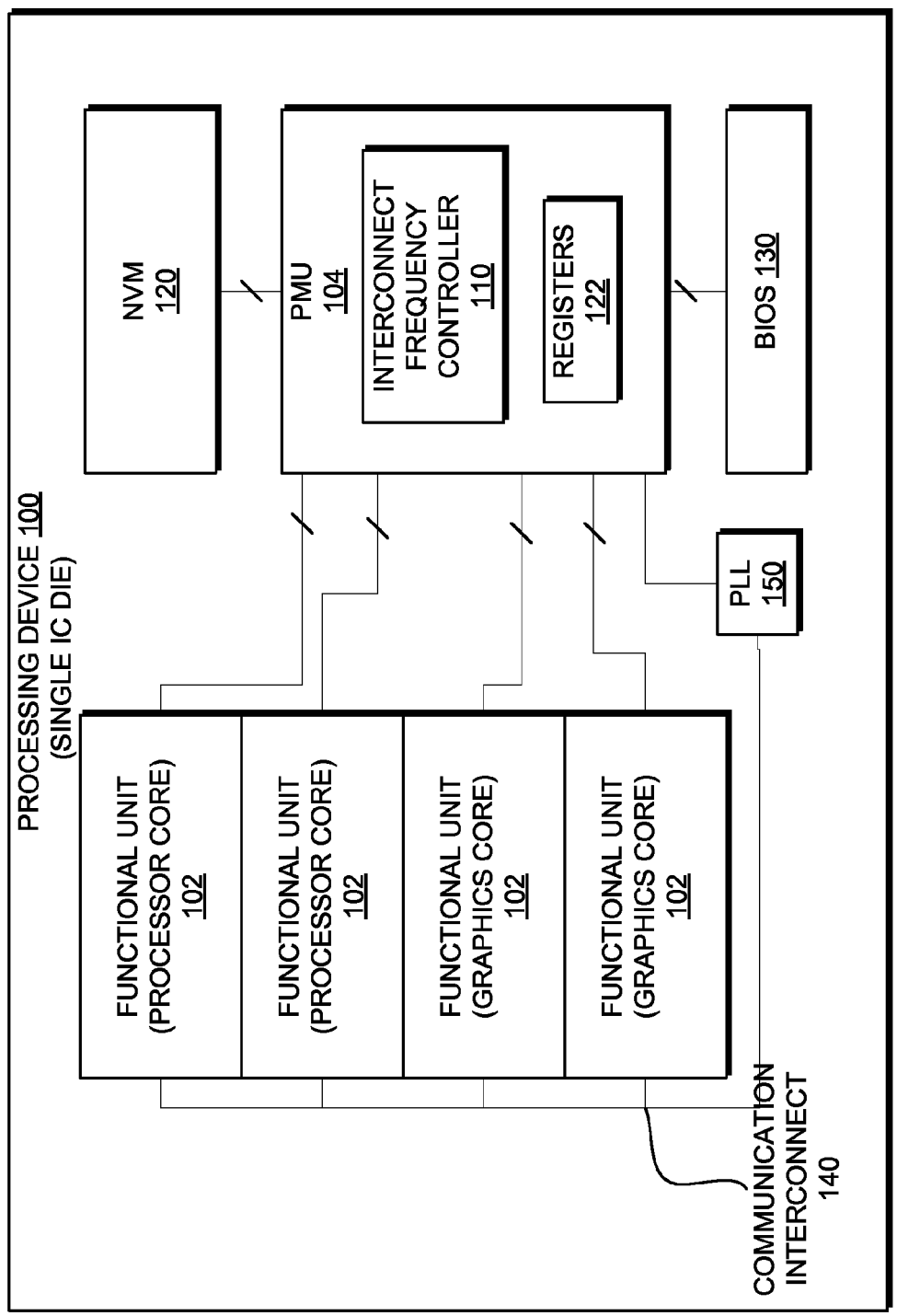
FIG. 1 is a block diagram of a processing device that implements an interconnect frequency controller for multiple functional hardware units of an integrated circuit die according to one embodiment.

Embodiments of the disclosure provide for interconnect frequency control of an operating frequency of a communication interconnect between an integrated circuit comprising multiple functional hardware units (also referred to herein as functional units). In one embodiment, a power management unit (PMU) is configured to collect workload data from the functional hardware units and determine a workload metric from the workload data. The PMU adjusts an operating frequency of the communication interconnect in view of the workload metric.

In modern CPU environments, multiple functional units communicate between themselves via an internal communication interconnect (also referred to as an internal communication layer). For example, cache memory and various other elements in the computing environment communicate through an independent communication layer (CL). The CL can run at different frequencies, as decided by the PMU. The cache elements may run at the same frequency as the CL, but the CL can have a frequency that is different and independent from that of the computational elements. Current solutions statically set an operating frequency of the CL for an integrated circuit and do not change the operating frequency. However, operating the CL in a higher frequency than necessary may draw power that could be used better to run some other part of the system (e.g., a core) faster in order to gain more performance. Operating the CL in too low frequency may cause computing elements latency to the cache to grow, which could cause the computing elements to stall and lose performance. Too low of frequency on the CL could also cause a reduction in the bandwidth of access both to the cache and to main memory, which could reduce performance as well.

As described above, current solutions statically set an operating frequency of the communication layer (CL) for an integrated circuit and do not change the operating frequency. However, operating the CL in a higher frequency than necessary may draw power that could be used better to run some other part of the system (e.g., a core) faster in order to gain more performance. Operating the CL in too low frequency may cause computing elements latency to the cache to grow, which could cause the computing elements to stall and lose performance. Too low of frequency on the CL could also cause a reduction in the bandwidth of access both to the cache and to main memory, which could reduce performance as well. With the current solution, the CL runs at a frequency fixed to that of the computational element's frequency. It will match the average for most workloads; however, it would be too high for most of the workloads, and too low for some. The embodiments described herein determine a frequency to run the CL in order to achieve performance under power constraints. Running the CL at the optimal frequency could increase performance under power constrained scenarios, when the power would better be used to speed up the computational element than run the CL faster, or when the computational elements stall too much it would be better to speed up the CL for faster access to its resources. Some embodiments described herein collect various micro-architectural performance data, such as data that is relevant to bandwidth, stalls and latency of the functional hardware units, performance data relevant to the performance of the cache, and data relevant to performance of the CL. This data is collectively referred to herein as workload data. That is, the workload dependent data is data that reflects the workloads of the communication interconnect (i.e., the CL), the cache elements, the computation elements, memory connections, etc. The workload data can be used to determine a workload metric for adjusting the operating frequency of the communication interconnect, as described herein. The embodiments described herein collect information of the system in order to get a frequency for the communication interconnect that best matches the workload and is workload dependent. For example, a workload with low requirement for CL resources would receive a low CL frequency, while a workload with high requirement for CL resources would receive a higher CL frequency. The CL frequency, as described herein, is not fixed to the computational element's frequency. Rather the CL frequency is matched to the workload based on collected workload-dependent data, such as system bandwidth, latency, or stalls data.

FIG. 1 is a block diagram of one embodiment of a processing device 100 that implements a interconnect frequency controller 110 for multiple functional hardware units 102 of an integrated circuit die. In one embodiment, the processing device 100 is integrated in an integrated circuit die having multiple functional hardware units 102 (hereafter referred to as a multi-core system). In another embodiment, the processing device 100 is integrated into multiple dies in a single package. The multi-core system may be a multi-core processor package, but may include other types of functional units than just processor cores. Functional hardware units 102 may be processor cores, graphics cores (also referred to as graphics units), cache elements, computation elements, voltage regulator (VR) phases, input/output (I/O) interfaces (e.g., serial links, DDR memory channels), and their controllers, network controllers, fabric controllers, or any combination thereof. Functional units 102 may or may not share caches, and they may implement message passing or shared memory inter-core communication methods on a communications interconnect 140. Homogeneous multi-core systems are systems with identical cores. Sometimes identical cores are also referred to as equivalent cores. Heterogeneous multi-core systems have cores that are not identical or disparate functional units. Just as with single-processor systems, cores in multi-core systems may implement architectures such as superscalar, multithreading, vector processing or the like. It should be noted that the embodiments described below are described in the context of an example multi-core system including multiple processor cores and multiple graphics cores for simplicity of description.

The processing device 100 is a multi-core system, which is a single computing component with multiple independent central processing units (CPUs), which are functional units 102 that read and execute program instructions. The multi-core systems implements multiprocessing in a single physical package. The processing device 100 also includes multiple graphics cores, which are configured to accelerate the building of images intended for output to a display.

The processing device 100 also includes a power management unit (PMU) 104 that implements the interconnect frequency controller 110, some embodiments of which are described in more detail below. The PMU 104 may include registers 122 and may interact with a non-volatile memory (NVM) device 120, which may be integrated into the same package as the PMU 104 or may be available on the same platform as the processing device 100, but not on the same package. The NVM device 120 is computer memory that can retain the stored information even when not powered. Examples of NVM include read-only memory, flash memory, hard disks or the like. The processing device 100 may also include volatile memory, such as in the form of random access memory (RAM) or registers. In one embodiment, the interconnect frequency controller 110 utilizes registers 122 to store workload metrics as described herein. Alternatively, the interconnect frequency controller 110 may store the workload metrics in NVM 120, which may be on the same package as the PMU 104, or on a platform as described herein. In another embodiment, the interconnect frequency controller 110 may store the workload data and the workload metrics in other memory locations, e.g., RAM, ROM, main memory, cache or the like.

The PMU 104 governs power functions of the functional units 102. The PMU 104 may be an on-die microcontroller that has similar components to a computer, including firmware, software, memory, a CPU, I/O functions, timers, as well as analog-to-digital converters to receive measurements from sensors of the functional units 102. In one embodiment, the PMU 104 executes code, referred to as pcode, to implement the interconnect frequency controller 110. Alternatively, the interconnect frequency controller 110 can be implemented as hardware (e.g., circuitry, dedicated logic, programmable logic, microcode, etc.), firmware, software or any combination of the above. The PMU 104 may have its own embedded firmware and can measure inputs on temperature, current, power, as well as operating system (OS) requests. The PMU 104 can be used to independently clock the functional units 102. In one embodiment, the PMU 104 receives input from each of the functional units 102 and determines an operating voltage and an operating frequency for each of the functional units 102. The PMU 104 can also monitor OS performance state requests to be able to make decisions about what power/performance state to go into. In various embodiments described below, the PMU 104 can also collect various micro-architectural data relevant to bandwidth, stalls, latency or the like from the functional hardware units 102. For example, the PMU 104 can read counters from the functional units 102 that store this data, such a pending queue sizes, number of cache stalls while waiting for the communication interconnect 140 or the like.

In one embodiment, the interconnect frequency controller 110 collects workload data from the functional hardware units 102 and determines a workload metric from the workload data. The interconnect frequency controller 110 adjusts an operating frequency of the communication interconnect 140 in view of the workload metric. Additional details of some embodiments of the interconnect frequency controller 110 are described below with respect to FIGS. 2-5.

In some embodiment, the interconnect frequency control 110 controls the operating frequency of the communication interconnect 140 using a phase-locked loop (PLL) circuit 150. For example, the PLL 150 receives an input value from the PMU 104 to set the operating frequency of the communication interconnect 140. When the PMU 104 adjusts the operating frequency, the PMU 104 changes the input of the PLL 150. Alternatively, other frequency signal generation circuits may be used for generating and adjusting the operating frequency of the communication interconnect 140 as would be appreciated by one of ordinary skill in the art having the benefit of this disclosure. In some embodiments, the interconnect frequency controller 110 communicates with BIOS 130 of the processing device 100 to identify the functional units 102.

The components of FIG. 1 can reside on "a common carrier substrate," such as, for example, an integrated circuit ("IC") die substrate, a multi-chip module substrate or the like. Alternatively, the processing device 100 may reside on one or more printed circuit boards, such as, for example, a mother board, a daughter board or other type of circuit card. In other implementations, the main memory and the processing device 100 can reside on the same or different carrier substrates. In other implementations, the NVM 120 and the processing device 100 can reside on the same or different carrier substrates. In another embodiment, the PMU 104 is integrated on a second integrated circuit die that is separate from the integrated circuit die on which the functional units 102 reside. Also, as noted above, the NVM 120 may also reside on a separate integrated circuit die from the functional units 102 or the PMU 104.

Figure 2:
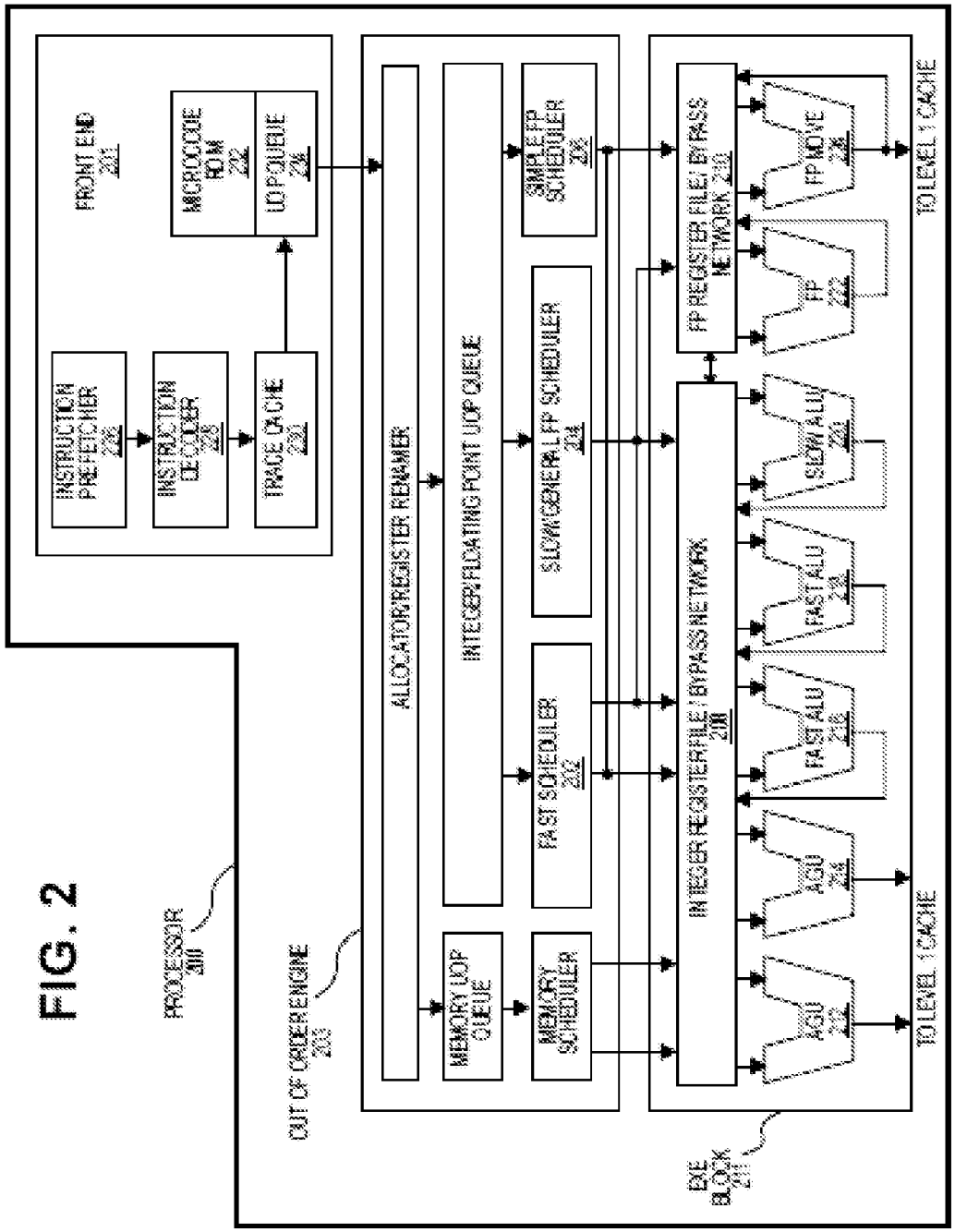
FIG. 2 is a block diagram of a processor according to one embodiment.

FIG. 2 is a block diagram of the micro-architecture for a processor 200 that includes logic circuits to perform instructions in accordance with one embodiment of the present invention. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 201 is the part of the processor 200 that fetches instructions to be executed and prepares them to be used later in the processor pipeline. The front end 201 may include several units. In one embodiment, the instruction prefetcher 226 fetches instructions from memory and feeds them to an instruction decoder 228 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 230 takes decoded uops and assembles them into program ordered sequences or traces in the uop queue 234 for execution. When the trace cache 230 encounters a complex instruction, the microcode ROM 232 provides the uops needed to complete the operation.

Some instructions are converted into a single micro-op, whereas others need several micro-ops to complete the full operation. In one embodiment, if more than four micro-ops are needed to complete an instruction, the decoder 228 accesses the microcode ROM 232 to do the instruction. For one embodiment, an instruction can be decoded into a small number of micro ops for processing at the instruction decoder 228. In another embodiment, an instruction can be stored within the microcode ROM 232 should a number of micro-ops be needed to accomplish the operation. The trace cache 230 refers to an entry point programmable logic array (PLA) to determine a correct micro-instruction pointer for reading the micro-code sequences to complete one or more instructions in accordance with one embodiment from the micro-code ROM 232. After the microcode ROM 232 finishes sequencing micro-ops for an instruction, the front end 201 of the machine resumes fetching micro-ops from the trace cache 230.

The out-of-order execution engine 203 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. The uop schedulers 202, 204, 206 determine when a uop is ready to execute based on the readiness of their dependent input register operand sources and the availability of the execution resources the uops need to complete their operation. The fast scheduler 202 of one embodiment can schedule on each half of the main clock cycle while the other schedulers can schedule once per main processor clock cycle. The schedulers arbitrate for the dispatch ports to schedule uops for execution.

Register files 208, 210 sit between the schedulers 202, 204, 206, and the execution units 212, 214, 216, 218, 220, 222, 224 in the execution block 211. There is a separate register file 208, 210 for integer and floating point operations, respectively. Each register file 208, 210, of one embodiment also includes a bypass network that can bypass or forward just completed results that have not yet been written into the register file to new dependent uops. The integer register file 208 and the floating point register file 210 are also capable of communicating data with the other. For one embodiment, the integer register file 208 is split into two separate register files, one register file for the low order 32 bits of data and a second register file for the high order 32 bits of data. The floating point register file 210 of one embodiment has 128 bit wide entries because floating point instructions typically have operands from 64 to 128 bits in width.

The execution block 211 contains the execution units 212, 214, 216, 218, 220, 222, 224, where the instructions are actually executed. This section includes the register files 208, 210, that store the integer and floating point data operand values that the micro-instructions need to execute. The processor 200 of one embodiment is comprised of a number of execution units: address generation unit (AGU) 212, AGU 214, fast ALU 216, fast ALU 218, slow ALU 220, floating point ALU 222, floating point move unit 224. For one embodiment, the floating point execution blocks 222, 224, execute floating point, MMX, SIMD, and SSE, or other operations. The floating point ALU 222 of one embodiment includes a 64 bit by 64 bit floating point divider to execute divide, square root, and remainder micro-ops. For embodiments of the present invention, instructions involving a floating point value may be handled with the floating point hardware. In one embodiment, the ALU operations go to the high-speed ALU execution units 216, 218. The fast ALUs 216, 218, of one embodiment can execute fast operations with an effective latency of half a clock cycle. For one embodiment, most complex integer operations go to the slow ALU 220 as the slow ALU 220 includes integer execution hardware for long latency type of operations, such as a multiplier, shifts, flag logic, and branch processing. Memory load/store operations are executed by the AGUs 212, 214. For one embodiment, the integer ALUs 216, 218, 220 are described in the context of performing integer operations on 64 bit data operands. In alternative embodiments, the ALUs 216, 218, 220 can be implemented to support a variety of data bits including 16, 32, 128, 256, etc. Similarly, the floating point units 222, 224 can be implemented to support a range of operands having bits of various widths. For one embodiment, the floating point units 222, 224 can operate on 128 bits wide packed data operands in conjunction with SIMD and multimedia instructions.

In one embodiment, the uops schedulers 202, 204, 206 dispatch dependent operations before the parent load has finished executing. As uops are speculatively scheduled and executed in processor 200, the processor 200 also includes logic to handle memory misses. If a data load misses in the data cache, there can be dependent operations in flight in the pipeline that have left the scheduler with temporarily incorrect data. A replay mechanism tracks and re-executes instructions that use incorrect data. The dependent operations should be replayed and the independent ones are allowed to complete. The schedulers and replay mechanism of one embodiment of a processor are also designed to catch instruction sequences for text string comparison operations.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data. For the discussions below, the registers are understood to be data registers designed to hold packed data, such as 64 bits wide MMX registers (also referred to as 'mm' registers in some instances) in microprocessors enabled with the MMX™ technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 3:
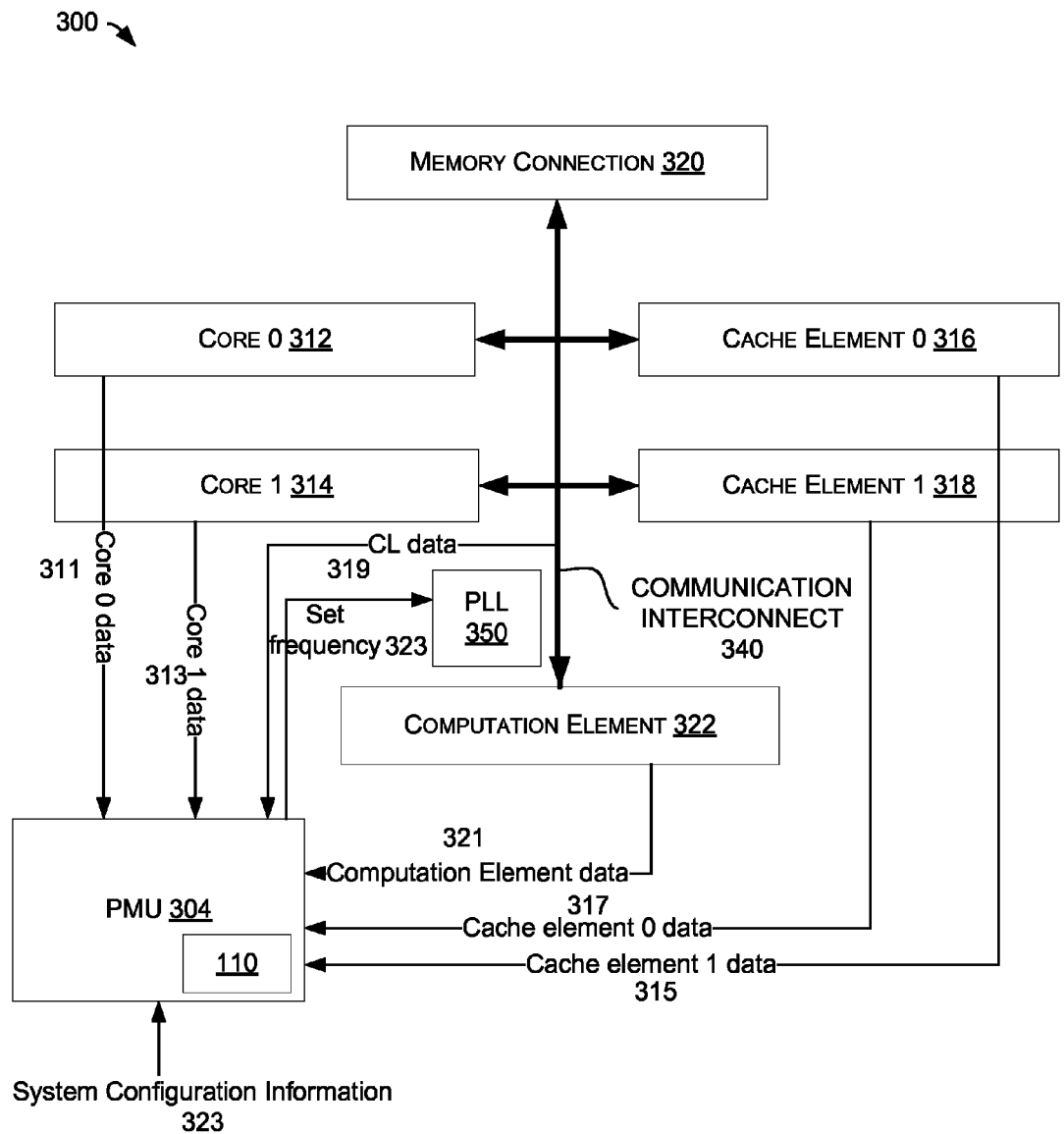
FIG. 3 is a block diagram a power management unit (PMU) implementing an interconnect frequency controller for two cores, two cache elements, a computation element, and a memory connection according to one embodiment.
Figure 4:
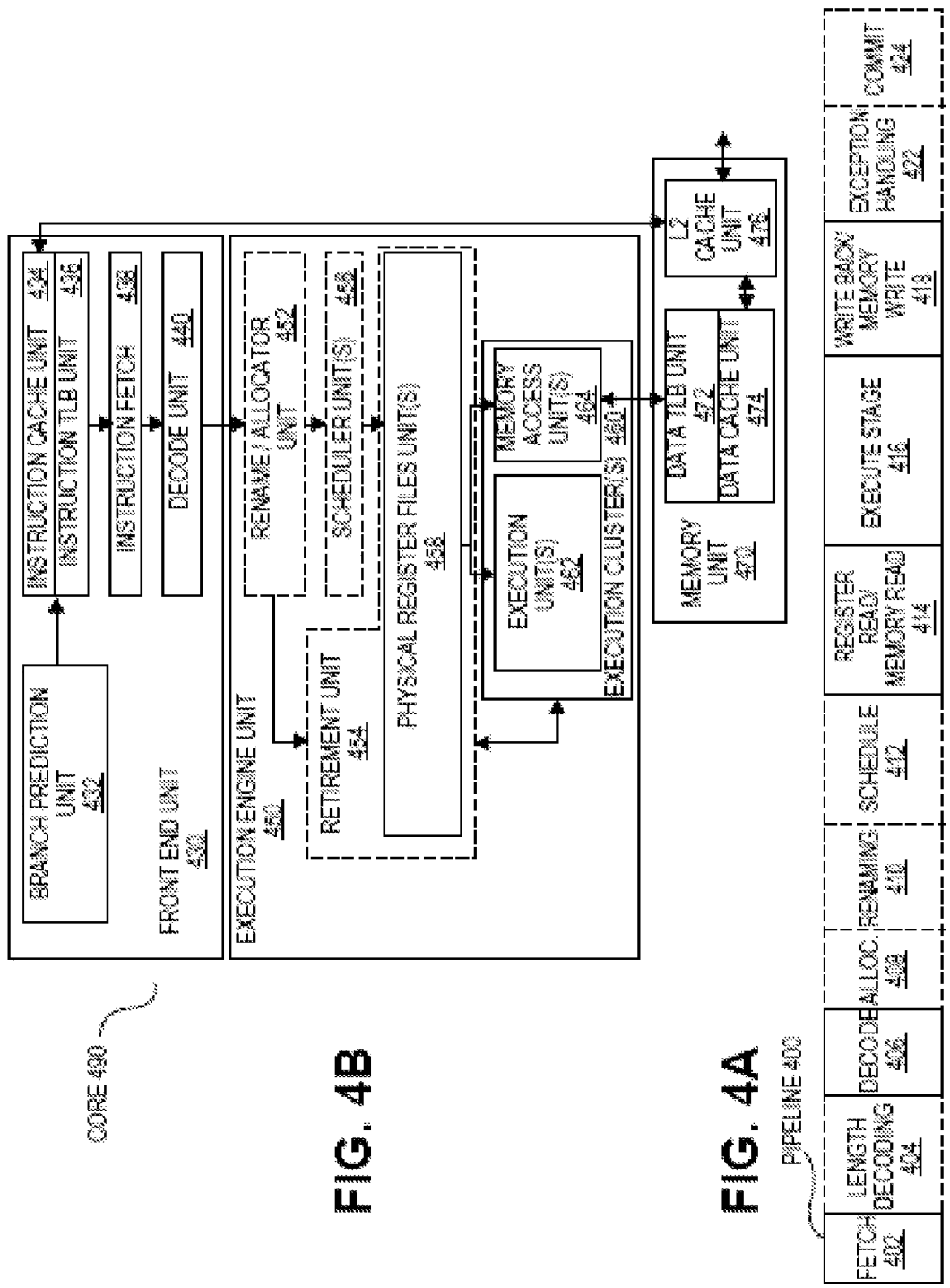
FIG. 4A illustrates elements of a processor micro-architecture according to one embodiment.
FIG. 4B illustrates elements of a processor micro-architecture according to one embodiment.

FIG. 3 is a block diagram of one embodiment of a power management unit (PMU) 304 implementing an interconnect frequency controller 110 for two cores, two cache elements, a computation element, and a memory connection. A communication interconnect 340 is coupled to a first core 312, a second core 314, a computation element 322, a first cache element 316, a second cache element 318 and a memory connection 320. The operating frequency of the communication interconnect 340 is set by a PLL 350, which is controlled by the PMU 304. In particular, the PMU 304 sends a set frequency input 323 to the PLL 350 to set the operating frequency. The PMU 304, using the interconnect frequency control 110, collects core data 311 from the first core 312, core data 313 from the second core 314, computation element data 321 from the computation element 322, cache element data 315 from the first cache element 316, cache element data 317 from the second cache element 318, and communication layer (CL) data 319 from the communication interconnect 340 itself. The PMU 304 can also receive data from the memory connection 320 to a memory (not illustrated). The PMU 304 can also receive system configuration information 323. The system configuration information 323 may be already known parameters, such as the frequency of the various elements, the number of computational elements and cache, the memory bandwidth, the power consumed by the different elements, the number of threads running in the system, as well as other parameters. The data is indicative of the workload data, including bandwidth, stalls, latency, and other performance metrics of the various elements. The PMU 304 may also collect power consumption metrics. The PMU 304 analyzes the workload data in order to determine the frequency of the communication interconnect 340. The PMU 304 can change the frequency of the communication interconnect 340 accordingly. In one embodiment, the PMU 304 can change the frequency of the communication interconnect 340 during a change of frequency of the other elements or at different times with or without changes to frequencies to the other elements.

In one embodiment, the interconnect frequency controller 110 is implemented in an algorithm of the PMU 304, such as in the pcode. The controller's algorithm can take many forms, such as control loops on certain variables, dividing the different data to different decisions of up/down based on thresholds, or any other algorithm that uses the above mentioned workload data to decide on how to change and set the frequency of the communication interconnect 340. In one embodiment, the algorithm includes 1) collecting micro-architectural data in the computational element 322, cores 312-314, cache elements 316-318, memory connection 320 and the communication interconnect 340 itself, or other data that pertains to bandwidth, stalls and latency of the functional units coupled to the communication interconnect 340; 2) sampling and analyzing the workload data, along with other available system information, such as the frequencies of the various domains, the number of cache elements, the number of threads in the system, the power consumed by different domains and other; 3) determining on a new frequency for the communication interconnect 340; and 4) setting the new frequency for the communication interconnect 340. As described herein, the changes of operating frequency of the communication interconnect 340 can happen during a change in frequency to any one or more of the other functional units or independently. The following are two examples of changes to the communication interconnect 340 based on collected workload data from the functional units coupled to the communication interconnect 340.

In these examples, it is assumed that the micro-architectural data is measured by the means of counters scattered along the system. The counters, for example, may be pending queues sizes, number of cache stalls while waiting for CL, or the like. In one example, the PMU 304 samples and analyzes the workload data from the counters and the counters show a low-performance dependence on the operating frequency of the communication interconnect (referred to CL frequency in these examples). For example, the counters have a low utilization of pending queues and low amount of cache stalls while waiting for CL. The low utilization may be measured as a threshold of pending queues and in this case and the number of pending queues falls below the threshold in this case. Similarly, the low amount of cache stalls can be set by a threshold. In this example, the PMU 304 determines that reducing the CL frequency does not reduce performance. Therefore, under power limited scenarios, the PMU 304 could gain power without reducing performance of the CL by reducing the CL frequency. This reduces the power consumption by the CL, which can create headroom for increasing the frequency of another element, such as the cache (CE) frequency.

In another example, the counters may show a high-performance dependent on the CL frequency. That is there is a high utilization of pending queues and a high amount of CE stalls while waiting for the CL. In this example, the PMU 304 can determine that increasing CL frequency would gain performance. In addition, if the current system configuration shows that increasing CL frequency is more power efficient than increasing CE frequency, i.e. that in the same amount of power increasing CL frequency and decreasing CE frequency may result in overall higher performance. High utilization may be measured as a threshold of pending queues, and the number of pending queues exceeds the threshold in this case. Similarly, the high amount of cache stalls can be set by a threshold. These thresholds may be the same thresholds set for the low utilization or low amount of cache stalls or separate thresholds may be used. The algorithm may also use other technologies or techniques than counters and thresholds to determine what adjustments can be made to the CL frequency.

FIG. 4A is a block diagram illustrating an in-order pipeline and a register renaming stage, out-of-order issue/execution pipeline according to at least one embodiment of the invention. FIG. 4B is a block diagram illustrating an in-order architecture core and a register renaming logic, out-of-order issue/execution logic to be included in a processor according to at least one embodiment of the invention. The solid lined boxes in FIG. 4A illustrate the in-order pipeline, while the dashed lined boxes illustrates the register renaming, out-of-order issue/execution pipeline. Similarly, the solid lined boxes in FIG. 4B illustrate the in-order architecture logic, while the dashed lined boxes illustrates the register renaming logic and out-of-order issue/execution logic.

In FIG. 4A, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

In FIG. 4B, arrows denote a coupling between two or more units and the direction of the arrow indicates a direction of data flow between those units. FIG. 4B shows processor core 490 including a front end unit 430 coupled to an execution engine unit 450, and both are coupled to a memory unit 470.

The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, graphics core, or the like.

The front end unit 430 includes a branch prediction unit 432 coupled to an instruction cache unit 434, which is coupled to an instruction translation lookaside buffer (TLB) 436, which is coupled to an instruction fetch unit 438, which is coupled to a decode unit 440. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 434 is further coupled to a level 2 (L2) cache unit 476 in the memory unit 470. The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 458 is overlapped by the retirement unit 154 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 454 and the physical register file(s) unit(s) 458 are coupled to the execution cluster(s) 460. The execution cluster(s) 460 includes a set of one or more execution units 162 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one exemplary embodiment, the memory access units 464 may include a load unit, a store address unit, and a store data unit, each of which is coupled to the data TLB unit 472 in the memory unit 470. The L2 cache unit 476 is coupled to one or more other levels of cache and eventually to a main memory.

By way of example, the exemplary register renaming, out-of-order issue/execution core architecture may implement the pipeline 400 as follows: 1) the instruction fetch 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 perform the execute stage 416; 6) the memory unit 470 and the physical register file(s) unit(s) 458 perform the write back/ memory write stage 418; 7) various units may be involved in the exception handling stage 422; and 8) the retirement unit 454 and the physical register file(s) unit(s) 458 perform the commit stage 424.

The core 490 may support one or more instructions sets (e.g., the x86 instruction set (with some extensions that have been added with newer versions); the MIPS instruction set of MIPS Technologies of Sunnyvale, Calif.; the ARM instruction set (with additional extensions such as NEON) of ARM Holdings of Sunnyvale, Calif.).

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 5:
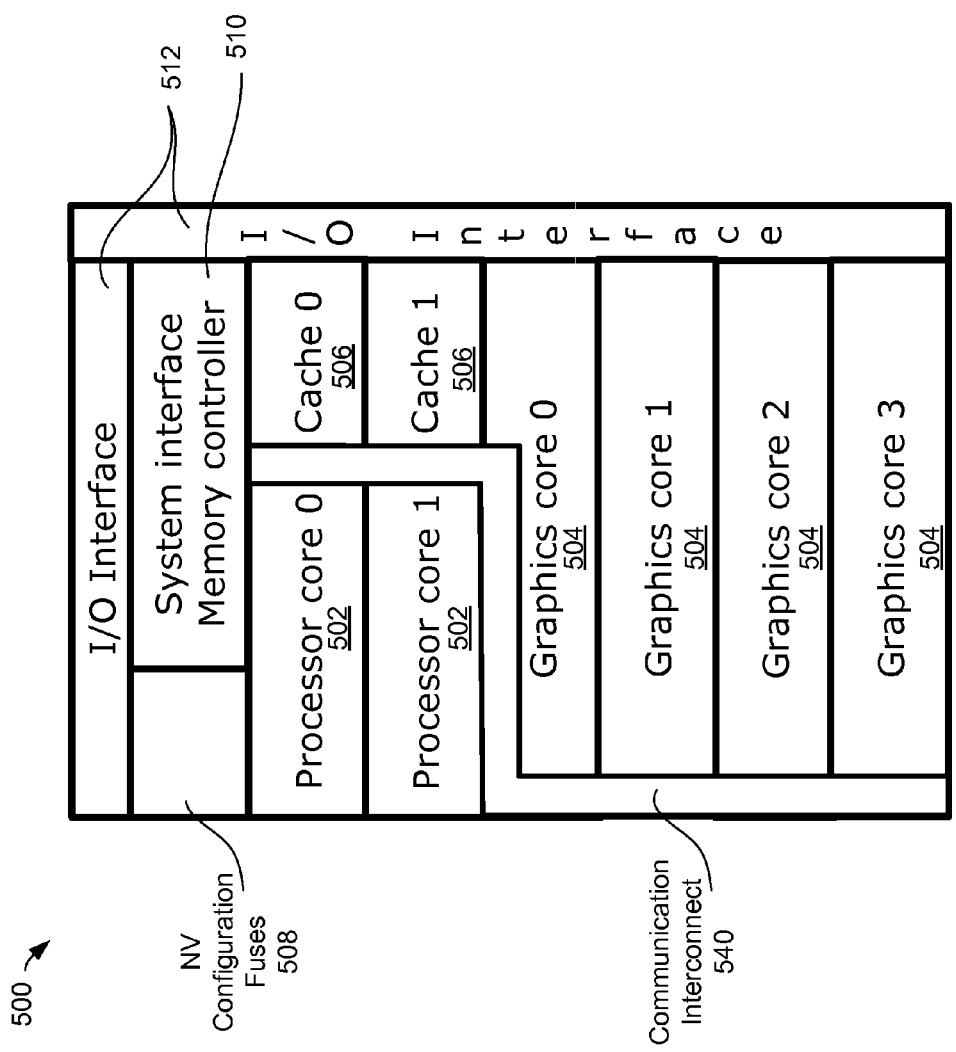
FIG. 5 is a block diagram illustrating a multi-core system including two processor cores and four graphics cores with a communication interconnect controlled by the interconnect frequency controller according to one embodiment.

FIG. 5 is a block diagram illustrating one embodiment of a multi-core system 500 including two processor cores 502 and four graphics cores 504. The multi-core system 500 also includes two caches 506 corresponding to the two processor cores 502, non-volatile configuration fuse bits 508, system interface memory controller 510 and I/O interfaces 512. The processor cores 502, graphics cores 504, caches 506, and system interface memory controller 510 are coupled to a communication interconnect 540. The PMU 104 (illustrated in FIG. 1) or PMU 304 (illustrated in FIG. 3) is configured to collect workload data and calculate the workload metrics for the processor cores 502 and the graphics cores 504 as described herein. The PMU 104, 304 also collects workload data and calculates the workload metrics for the caches 506, the system interface memory controller 510. The non-volatile configuration fuse bits 508 can refer to one-time programmable bits that can be burned with a set of programming values at the factory to customize the functionality of each chip. The PMU 104, 204 may use the non-volatile configuration fuse bits 508 to store configuration values, look-up tables and constants used in workload metric calculations. The system interface memory controller 510 is used to send and receive data from memory (non-cache memory) outside the multi-core system 500. The I/O interfaces 512 can be the physical interfaces to other components external to the multi-core system 500.

Figure 6:
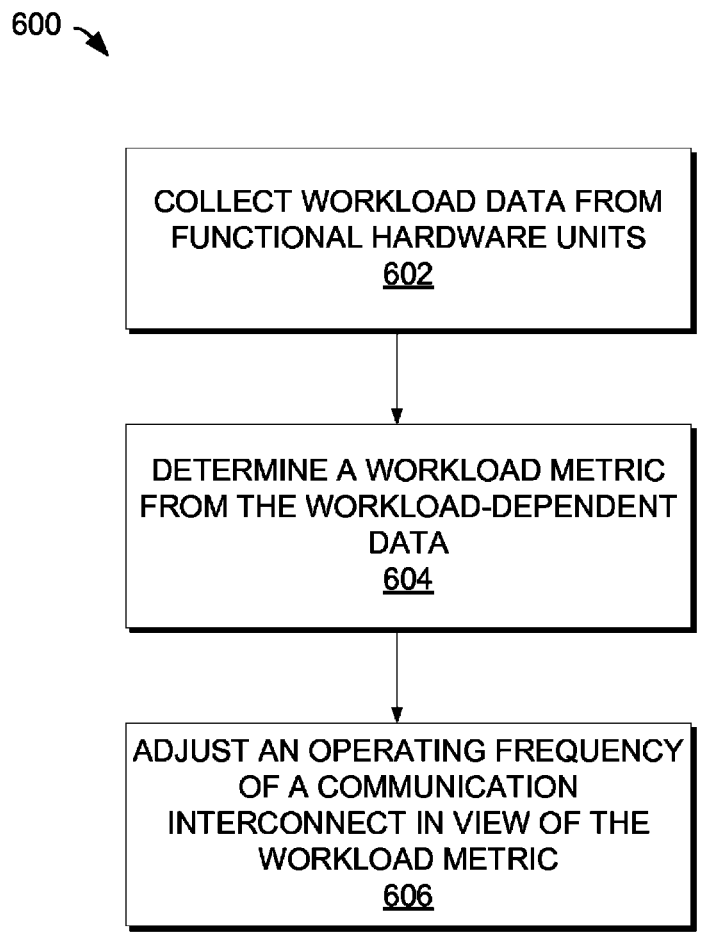
FIG. 6 is a flow diagram illustrating a method of adjusting an operating frequency of a communication interconnect between functional hardware units of an integrated circuit die according to one embodiment.

FIG. 6 is a flow diagram illustrating a method 600 of adjusting an operating frequency of a communication interconnect between functional hardware units of a single integrated circuit die according to one embodiment. Method 600 may be performed by processing logic that may comprise hardware (e.g., circuitry, dedicated logic, programmable logic, microcode, etc.), software (such as instructions run on a processing device), firmware or a combination thereof. In one embodiment, method 600 is performed by processing device 100, and more specifically PMU 104 of FIG. 1. In another embodiment, the method 600 is performed by interconnect frequency controller 110 as described herein. In another embodiment, the method 600 is performed by the PMU 304 of FIG. 3.

Referring to FIG. 6, the method 600 begins by the processing logic collecting workload data from the functional hardware units of an integrated circuit (block 602). The workload data may be micro-architectural data of the functional units regarding the bandwidth, stalls, latency or other performance data of the functional units. The processing logic may also receive other known system parameters, such as the frequencies of the various domains, the number of cache elements, the number of threads in the system, the power consumed by different domains, temperature, voltage, frequency, power state, OS performance state requests or the like. The processing logic may collect this data continually, or the processing logic may sample the data periodically, such as on a fixed-time interval, or in response to a trigger, such as a change in state or condition of the system. Based on the collected workload data, the processing logic calculates determines a workload metrics (block 604). The processing logic adjusts an operating frequency of a communication interconnect in view of the workload metric (block 606).

Figure 7:
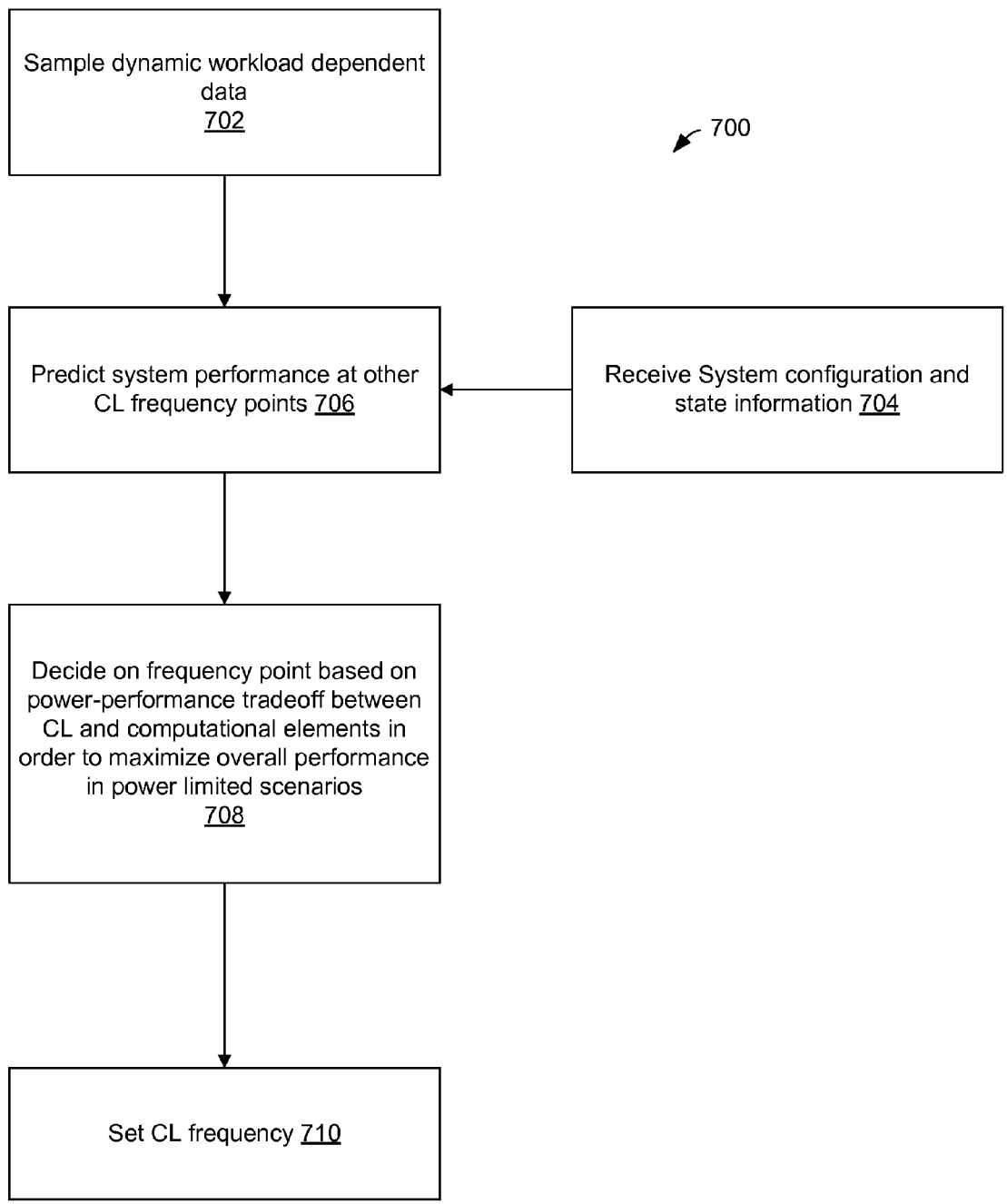
FIG. 7 is a flow diagram illustrating a method of setting a communication layer frequency based on a power-performance tradeoff between the communication layer and computational elements according to another embodiment.

FIG. 7 is a flow diagram illustrating a method 700 of setting a communication layer frequency based on a power-performance tradeoff between the communication layer and computational elements according to another embodiment. Method 700 may be performed by processing logic that may comprise hardware, software, firmware or a combination thereof. In one embodiment, method 700 is performed by processing device 100, PMU 104, PMU 304 or interconnect frequency controller 110 as described herein.

Referring to FIG. 7, the method 700 begins by the processing logic sampling dynamic workload-dependent data (block 702). For example, the processing logic can sample queue states, stall metrics, bandwidth utilization at various points, or the like. The processing logic may sample the data from data that has been collected by the various functional units and sent to the PMU for analysis. The processing logic may also receive system configuration and state information (block 704). For example, the processing logic may receive know parameters, such as number of cores, number of threads, current frequencies of the functional units, power states, or the like. Based on the dynamic workload-dependent data and the system configuration and state information, the processing logic predicts system performance at other CL frequency points (block 706). That is the system performance can be predicted at one or more higher CL frequencies or one or more lower CL frequencies. The processing logic decides which frequency point based on a power-performance tradeoff between CL and other elements in order to maximize overall performance in power limited scenarios (block 708). For example, the processing logic can decide to decrease CL frequency when it doesn't affect performance and increase computational element frequency (or cache frequency) within the same power envelope. The processing logic may also decide to increase CL frequency and lower computational element frequency (cache frequency) within the same power envelope. Based on the decision, the processing logic sets the CL frequency accordingly (block 710).

In one embodiment, the processing logic sets the CL frequency in a direct and static relation to the other functional units. For example, the processing logic can set the CL's frequency as a fixed multiple of the frequency of the computational elements (or cache elements) or to the highest between several multiples. Alternatively, the processing logic can set the CL frequency independent of the frequencies of the other functional units. The invention does not set a fixed relation between the frequency of the Computational Elements and the CL frequency. The embodiments described herein collect information of the system in order to get a frequency for the communication interconnect that best matches the workload and is workload dependent. For example, a workload with low requirement for CL resources would receive a low CL frequency, while a workload with high requirement for CL resources would receive a higher CL frequency.

Figure 8:
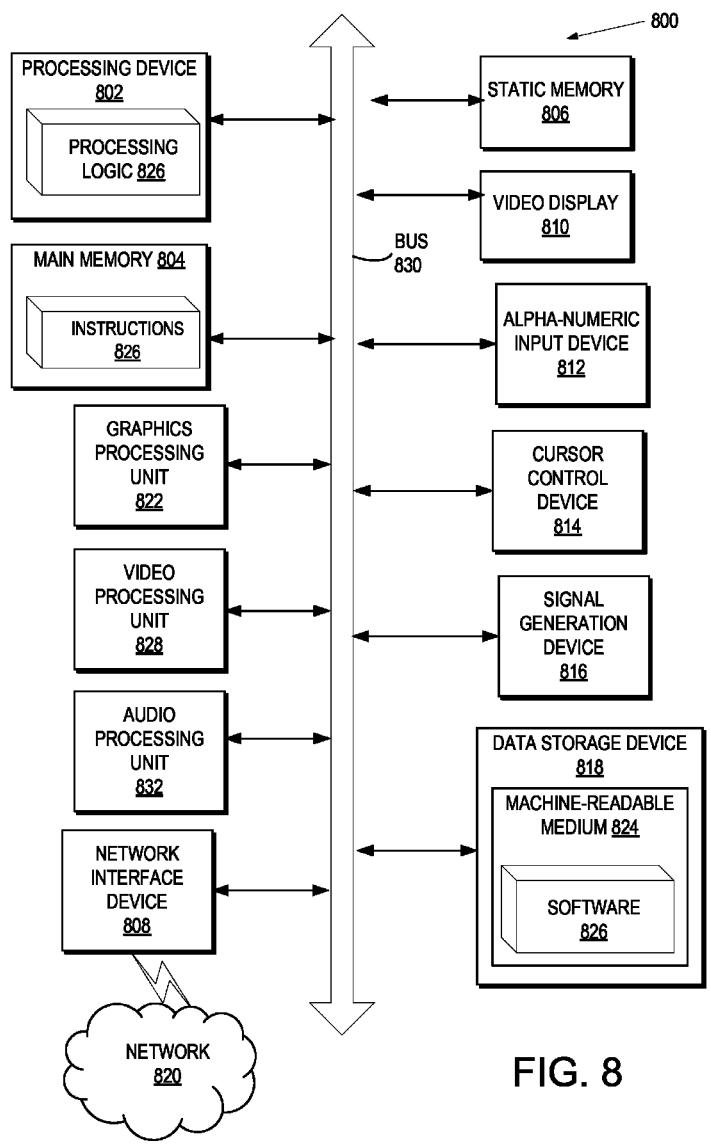
FIG. 8 illustrates a diagrammatic representation of a machine in the example form of a computing system within which a set of instructions may be executed for causing the computing system to perform any one or more of the methodologies discussed herein.

FIG. 8 illustrates a diagrammatic representation of a machine in the example form of a computing system 800 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computing system 800 includes a processing device 802, a main memory 804 (e.g., read-only memory (ROM), flash memory, dynamic random access memory (DRAM) (such as synchronous DRAM (SDRAM) or DRAM (RDRAM), etc.), a static memory 806 (e.g., flash memory, static random access memory (SRAM), etc.), and a data storage device 818, which communicate with each other via a bus 830.

Processing device 802 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. In one embodiment, processing device 802 may include one or processing cores. The processing device 802 is configured to execute the processing logic 826 for performing the operations discussed herein. In one embodiment, processing device 802 is the same as processing device 100 of FIG. 1 that implements interconnect frequency controller 110. In another embodiment, processing device 802 is the PMU 304 of FIG. 3 that implements interconnect frequency controller 110. Alternatively, the computing system 800 can include other components as described herein.

The computing system 800 may further include a network interface device 808 communicably coupled to a network 820. The computing system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a signal generation device 816 (e.g., a speaker), or other peripheral devices. Furthermore, computing system 800 may include a graphics processing unit 822, a video processing unit 828 and an audio processing unit 832. In another embodiment, the computing system 800 may include a chipset (not illustrated), which refers to a group of integrated circuits, or chips, that are designed to work with the processing device 802 and controls communications between the processing device 802 and external devices. For example, the chipset may be a set of chips on a motherboard that links the processing device 802 to very high-speed devices, such as main memory 804 and graphic controllers, as well as linking the processing device 802 to lower-speed peripheral buses of peripherals, such as USB, PCI or ISA buses.

The data storage device 818 may include a computer-readable storage medium 824 on which is stored software 826 embodying any one or more of the methodologies of functions described herein. The software 826 may also reside, completely or at least partially, within the main memory 804 as instructions 826 and/or within the processing device 802 as processing logic 826 during execution thereof by the computing system 800; the main memory 804 and the processing device 802 also constituting computer-readable storage media.

The computer-readable storage medium 824 may also be used to store instructions 826 utilizing the interconnect frequency controller 110, such as described with respect to FIG. 1 and FIG. 2, and/or a software library containing methods that call the above applications. While the computer-readable storage medium 824 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

Figure 9:
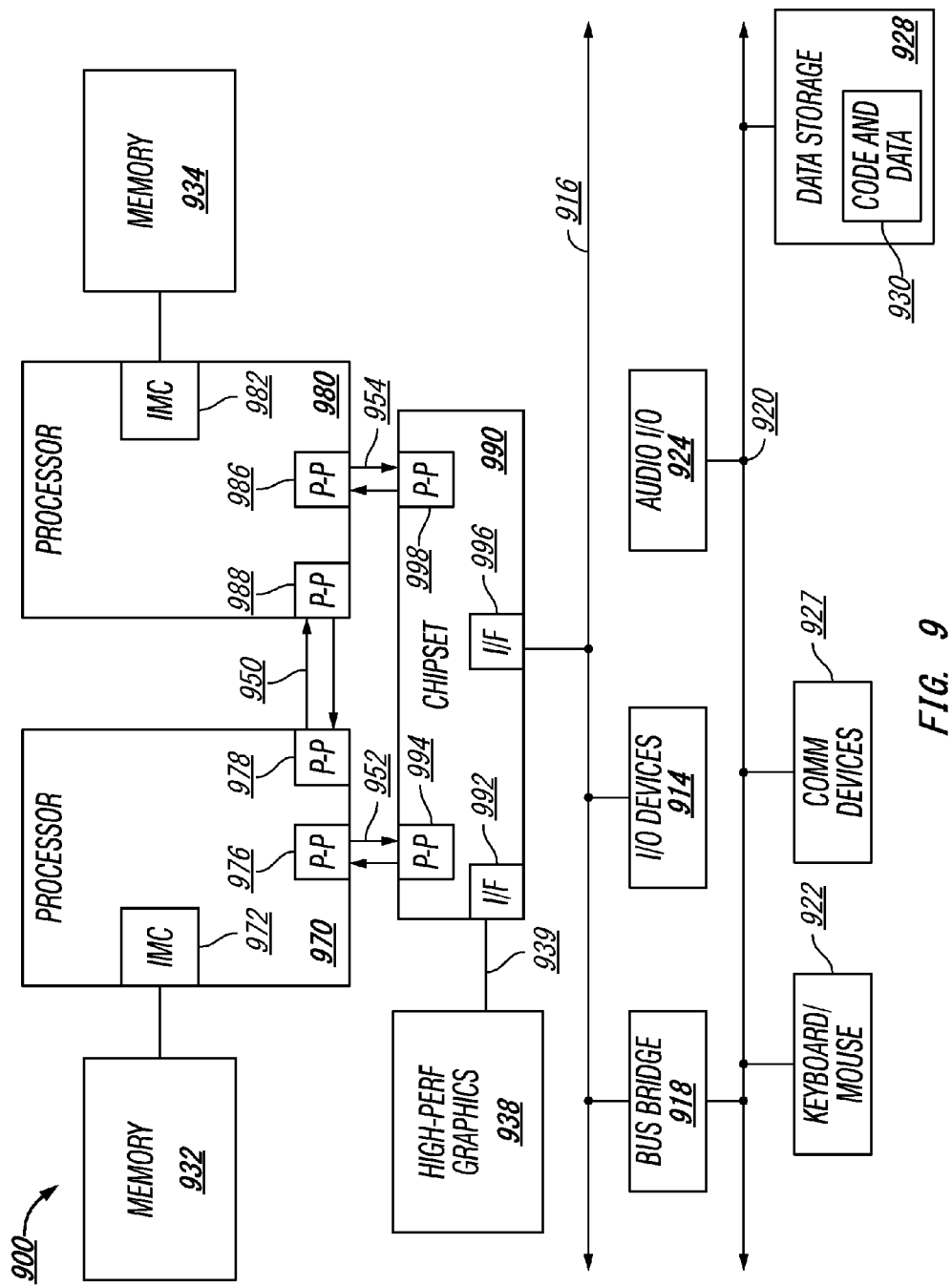
FIG. 9 is a block diagram of a computer system according to one embodiment.

Referring now to FIG. 9, shown is a block diagram of a second system 900 in accordance with an embodiment of the present invention. As shown in FIG. 9, multiprocessor system 900 is a point-to-point interconnect system, and includes a first processor 970 and a second processor 980 coupled via a point-to-point interconnect 950. Each of processors 970 and 980 may be some version of the processors of the computing systems as described herein.

While shown with two processors 970, 980, it is to be understood that the scope of the present disclosure is not so limited. In other embodiments, one or more additional processors may be present in a given processor.

Processors 970 and 980 are shown including integrated memory controller units 972 and 982, respectively. Processor 970 also includes as part of its bus controller units point-to-point (P-P) interfaces 976 and 978; similarly, second processor 980 includes P-P interfaces 986 and 988. Processors 970, 980 may exchange information via a point-to-point (P-P) interface 950 using P-P interface circuits 978, 988. As shown in FIG. 9, IMCs 972 and 982 couple the processors to respective memories, namely a memory 932 and a memory 934, which may be portions of main memory locally attached to the respective processors.

Processors 970, 980 may each exchange information with a chipset 990 via individual P-P interfaces 952, 954 using point to point interface circuits 976, 994, 986, 998. Chipset 990 may also exchange information with a high-performance graphics circuit 938 via a high-performance graphics interface 939.

A shared cache (not shown) may be included in either processor or outside of both processors, yet connected with the processors via P-P interconnect, such that either or both processors' local cache information may be stored in the shared cache if a processor is placed into a low power mode.

Chipset 990 may be coupled to a first bus 916 via an interface 996. In one embodiment, first bus 916 may be a Peripheral Component Interconnect (PCI) bus, or a bus such as a PCI Express bus or another third generation I/O interconnect bus, although the scope of the present disclosure is not so limited.

As shown in FIG. 9, various I/O devices 914 may be coupled to first bus 916, along with a bus bridge 918 which couples first bus 916 to a second bus 920. In one embodiment, second bus 920 may be a low pin count (LPC) bus. Various devices may be coupled to second bus 920 including, for example, a keyboard and/or mouse 922, communication devices 927 and a storage unit 928 such as a disk drive or other mass storage device which may include instructions/code and data 930, in one embodiment. Further, an audio I/O 924 may be coupled to second bus 920. Note that other architectures are possible. For example, instead of the point-to-point architecture of FIG. 9, a system may implement a multi-drop bus or other such architecture.

Figure 10:
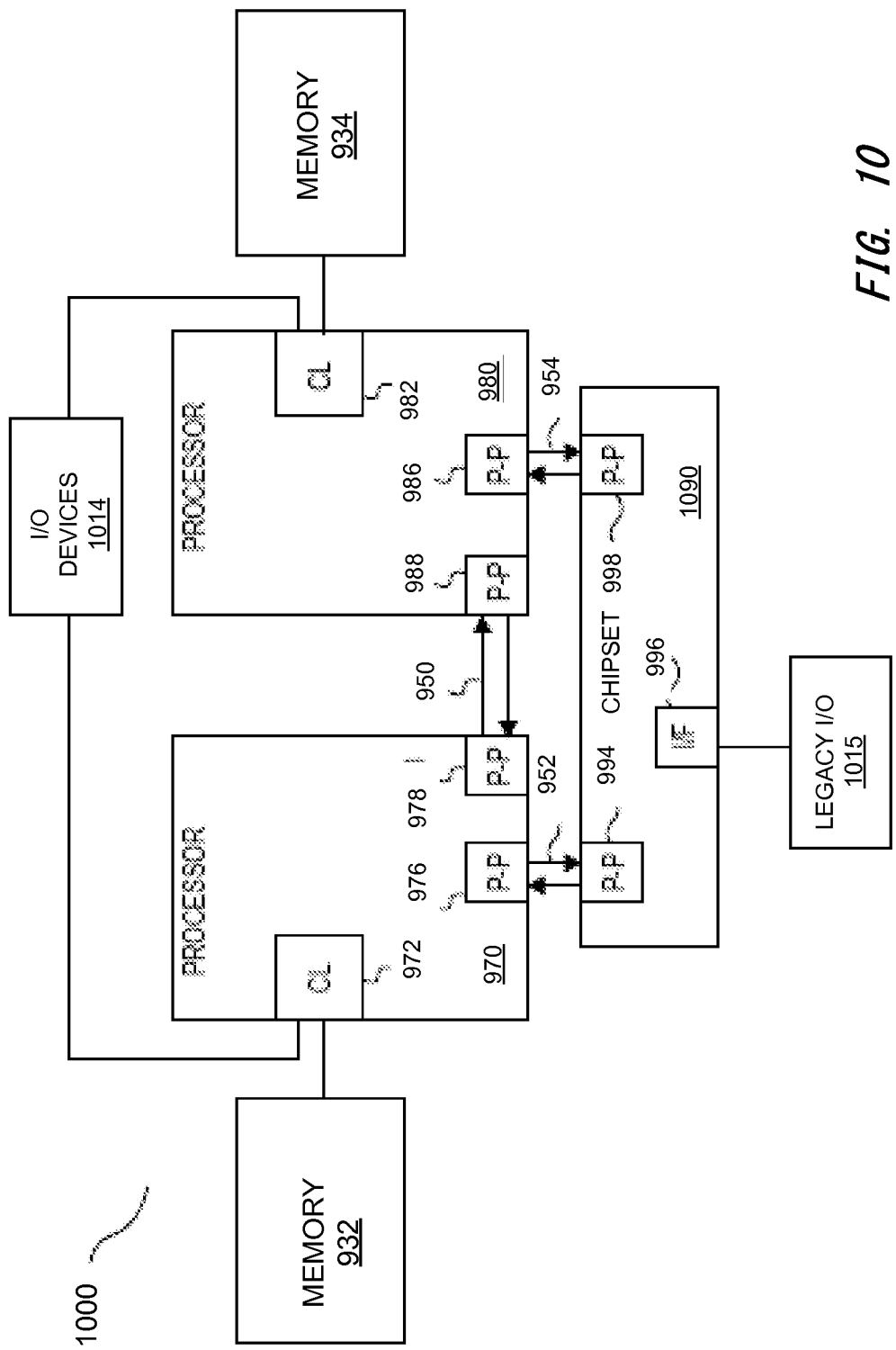
FIG. 10 is a block diagram of a computer system according to one embodiment.

Referring now to FIG. 10, shown is a block diagram of a third system 1000 in accordance with an embodiment of the present invention. Like elements in FIGS. 9 and 10 bear like reference numerals, and certain aspects of FIG. 9 have been omitted from FIG. 10 in order to avoid obscuring other aspects of FIG. 10.

FIG. 10 illustrates that the processors 1070, 1080 may include integrated memory and I/O control logic ("CL") 1072 and 1082, respectively. For at least one embodiment, the CL 1072, 1082 may include integrated memory controller units such as that described above in connection with FIG. 7. In addition. CL 1072, 1082 may also include I/O control logic. FIG. 10 illustrates that the memories 1032, 1034 are coupled to the CL 1072, 1082, and that I/O devices 1014 are also coupled to the control logic 1072, 1082. Legacy I/O devices 1015 are coupled to the chipset 1090.

The following examples pertain to further embodiments.

Example 1 is an integrated circuit comprising a communication interconnect; a plurality of functional hardware units each coupled to the communication interconnect; and a power management unit (PMU) coupled to the plurality of functional hardware units and the communication interconnect, wherein the PMU is configured to: 1) collect workload data from the plurality of functional hardware units; 2) determine a workload metric from the workload data; and 3) adjust an operating frequency of the communication interconnect in view of the workload metric.

In Example 2, the integrated circuit further comprises a phase-locked loop (PLL) coupled to the PMU, wherein the PLL is configured to receive an input from the PMU to set the operating frequency of the communication interconnect, and wherein the PMU is configured to adjust the operating frequency by changing the input of the PLL.

In Example 3, in the subject matter of any one of Examples 1-2, the plurality of functional hardware units can optionally comprise: a cache element coupled to the communication interconnect; a computation element coupled to the communication interconnect; a memory connection coupled to the communication interconnect; and a plurality of processor cores In Example 4, in the subject matter of any one of Examples 1-3, the PMU is optionally further configured to: 1) collect core data from the plurality of processor cores for the workload data; 2) collect cache element data from the cache element for the workload data; 3) collect computation element data from the computation element for the workload data; 4) collect memory connection data from the memory connection for the workload data; and 5) collect communication interconnect data from the communication interconnect.

In Example 5, in the subject matter of any of Examples 1-4, the PMU is optionally further configured to collect system configuration information, and wherein the PMU is configured to determine the workload metric from the workload data and the system configuration information.

In Example 6, in the subject matter of any of Examples 1-5, the workload data optionally comprises at least one of a pending queue size, a number of stalls waiting for the communication interconnect, or a latency.

In Example 7, in the subject matter of any of Examples 1-6, the PMU is optionally further configured to adjust the operating frequency of the communication interconnect during a change of frequency of one or more of the plurality of functional hardware units.

In Example 8, in the subject matter of any of Examples 1-7, the PMU is optionally further configured to compare the workload metric against a first threshold and a second threshold, and wherein the PMU is further configured to increase the operating frequency when the workload metric exceeds the first threshold and to decrease the operating frequency when the workload metric exceeds the second threshold.

In Example 9, in the subject matter of any of Examples 1-8, the PMU is optionally further configured to compare the workload metric against a first threshold and a second threshold, and wherein the PMU is further configured to increase the operating frequency when the workload metric exceeds the first threshold and to decrease the operating frequency when the workload metric exceeds the second threshold.

In Example 10, in the subject matter of any of Examples 1-9, the PMU is optionally further configured to select one of a plurality of fixed frequencies to adjust the operating frequency.

Various embodiments may have different combinations of the structural features described above. For instance, all optional features of the integrated circuit described above may also be implemented with respect to the method or process described herein and specifics in the examples may be used anywhere in one or more embodiments.

Example 11 is an method comprising 1) collecting, by a power management unit (PMU), workload data from the plurality of functional hardware units coupled together via a communication interconnect; 2) determining, by the PMU, a workload metric from the workload data; and 3) adjusting, by the PMU, an operating frequency of the communication interconnect in view of the workload metric.

In Example 12, the subject matter of Example 11 can optionally changing an input of a phase-locked loop (PLL) that sets the operating frequency of the communication interconnect.

In Example 13, the subject matter of any of Examples 11-12 can optionally collect the workload data by collecting core data from a plurality of processor cores for the workload data; collecting cache element data from a cache element for the workload data; collecting computation element data from a computation element for the workload data; collecting memory connection data from a memory connection for the workload data; and collecting communication interconnect data from the communication interconnect.

In Example 14, in the subject matter of any of Examples 11-13, the workload data optionally comprises at least one of a pending queue size, a number of stalls waiting for the communication interconnect, or a latency.

In Example 15, the subject matter of any of Examples 11-14 can optionally adjust the operating frequency by adjusting the operating frequency during a change of frequency of one or more of the plurality of functional hardware units.

In Example 16, the subject matter of any of Examples 11-15 can optionally compare the workload metric against a first threshold and a second threshold; increase the operating frequency when the workload metric exceeds the first threshold; and decrease the operating frequency when the workload metric exceeds the second threshold.

In Example 17, the subject matter of any of Examples 11-16 can optionally adjust the operating frequency by selecting one of a plurality of fixed frequencies to adjust the operating frequency.

Various embodiments may have different combinations of the operational features described above. For instance, all optional features of the method described above may also be implemented with respect to a non-transitory, computer-readable storage medium. Specifics in the examples may be used anywhere in one or more embodiments.

Example 18 is a non-transitory, computer-readable storage medium including instructions that, when executed by a processor, cause the processor to perform the method of Examples 11-17.

Example 19 is a system comprising a single integrated circuit die comprising a plurality of functional hardware units, wherein the plurality of functional hardware units comprise at least two processor cores, at least two cache elements, a computation element, and a memory connection coupled together via a communication interconnect; and a memory device coupled to the memory connection; wherein the single integrated circuit die comprises a power management unit (PMU) configured to: collect workload data from the plurality of functional hardware units; determine a workload metric from the workload data; and adjust an operating frequency of the communication interconnect in view of the workload metric.

In Example 20, the subject matter of Example 27 can optionally comprise a phase-locked loop (PLL) coupled to the PMU, wherein the PLL is configured to receive an input from the PMU to set the operating frequency of the communication interconnect, and wherein the PMU is configured to adjust the operating frequency by changing the input of the PLL.

Example 21 is an apparatus for power management of a computing system, comprising: 1) a plurality of processor cores; 2) a plurality of cache elements; 3) a computation element; 4) a memory connection; 5) a communication interconnect coupled to the plurality of processor cores, the plurality of cache elements, the computation element and the memory connection, wherein the communication interconnect operates at an operating frequency; and 6) a power management unit (PMU) coupled to the plurality of processor cores, the plurality of cache elements, the computation element, the memory connection and the communication interconnect, wherein the PMU is configured to: a) obtain performance data from the plurality of processor cores, the plurality of cache elements, the computation element, the memory connection and the communication interconnect while the operating frequency is set to a first frequency; b) adjust the operating frequency to a second frequency in view of the performance data.

In Example 22, in the subject matter of Example 21, the PMU is optionally configured to obtain the performance data by receiving counter values from the plurality of processor cores, the plurality of cache elements, the computation element and the memory connection.

In Example 23, in the subject matter of any of Examples 21-22, the PMU is optionally configured to determine a performance dependence level on the operating frequency while at the first frequency, and wherein the PMU is further configured to decrease the operating frequency when the performance dependence level exceeds a low performance threshold and to increase the operating frequency when the performance dependence level exceeds a high performance threshold.

In Example 24, in the subject matter of any of Examples 21-24, the low performance threshold is optionally based on a first number of pending queues of the computation element and a second number of stalls to the plurality of cache elements waiting for the communication interconnect, and wherein the high performance threshold is optionally based on a third number of pending queues of the computation element and a fourth number of stalls to the plurality of cache elements waiting for the communication interconnect.

Example 25 is an apparatus comprising: 1) a plurality of processor cores; 2) a plurality of cache elements; 3) a computation element; 4) a memory connection; 5) a communication interconnect coupled to the plurality of processor cores, the plurality of cache elements, the computation element and the memory connection, wherein the communication interconnect operates at an operating frequency; 6) means for obtaining performance data from the plurality of processor cores, the plurality of cache elements, the computation element, the memory connection and the communication interconnect while the operating frequency is set to a first frequency; and 7) means for adjusting the operating frequency to a second frequency in view of the performance data.

In Example 26, the subject matter of Example 25 optionally comprises a phase-locked loop (PLL) coupled to the means for adjusting the operating frequency, wherein the PLL is configured to set the operating frequency of the communication interconnect.

Example 27 is an apparatus comprising: a memory; and a processor coupled to the memory, wherein the processor comprises a plurality of functional hardware units coupled together via a communication interconnect, wherein the processor configured to perform the method of any one of the Examples 11-17.

In Example 28, the subject matter of Example 27 optionally comprises a phase-locked loop (PLL) configured to set the operating frequency of the communication interconnect.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a selfconsistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the operations. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. An integrated circuit comprising:
   a communication interconnect;
   a plurality of functional hardware units each coupled to the communication interconnect; and
   a power management unit (PMU) coupled to the plurality of functional hardware units and the communication interconnect, wherein the PMU comprises an interconnect frequency controller to:
      collect workload data from the plurality of functional hardware units;
      collect system configuration information including power consumption metrics for the plurality of functional hardware units and current operating frequencies of the plurality of functional hardware units;
      determine a workload metric from the workload data and the system configuration information; and
      adjust an operating frequency of the communication interconnect up or down in view of the workload metric; and
   a phase-locked loop (PLL) coupled to the PMU, wherein the PLL is to receive an input from the PMU to set the operating frequency of the communication interconnect, and wherein the PMU is to adjust the operating frequency by changing the input of the PLL.

2. The integrated circuit of claim 1, wherein the plurality of functional hardware units comprises:
   a cache element coupled to the communication interconnect;
   a computation element coupled to the communication interconnect;
   a memory connection coupled to the communication interconnect; and
   a plurality of processor cores.

3. The integrated circuit of claim 2, wherein the interconnect frequency controller is further to:
   collect core data from the plurality of processor cores for the workload data;
   collect cache element data from the cache element for the workload data;
   collect computation element data from the computation element for the workload data;
   collect memory connection data from the memory connection for the workload data; and
   collect communication interconnect data from the communication interconnect.

4. The integrated circuit of claim 1, wherein the system configuration information further comprises at least one of a power state of the integrated circuit, a number of a plurality of plurality of processor cores, a number of cache elements or a number of threads.

5. The integrated circuit of claim 1, wherein the workload data comprises at least one of a pending queue size, a number of stalls waiting for the communication interconnect, or a latency.

6. The integrated circuit of claim 1, wherein the interconnect frequency controller is further to adjust the operating frequency of the communication interconnect during a change of frequency of one or more of the plurality of functional hardware units.

7. The integrated circuit of claim 1, wherein the interconnect frequency controller is further to compare the workload metric against a first threshold and a second threshold, and wherein the PMU is further to increase the operating frequency when the workload metric exceeds the first threshold and to decrease the operating frequency when the workload metric exceeds the second threshold.

8. The integrated circuit of claim 1, wherein the interconnect frequency controller is further to select one of a plurality of fixed frequencies to adjust the operating frequency.

9. A method comprising:
   collecting, by a power management unit (PMU), workload data from a plurality of functional hardware units coupled together via a communication interconnect;
   collecting, by the PMU, system configuration information including power consumption metrics for the plurality of functional hardware units and current operating frequencies of the plurality of functional hardware units;
   determining, by the PMU, a workload metric from the workload data and the system configuration; and
   adjusting, by the PMU, an operating frequency of the communication interconnect up or down in view of the workload metric, wherein adjusting the operating frequency comprises changing an input of a phase-locked loop (PLL) that sets the operating frequency of the communication interconnect.

10. The method of claim 9, wherein the collecting comprises:
    collecting core data from a plurality of processor cores for the workload data;
    collecting cache element data from a cache element for the workload data;
    collecting computation element data from a computation element for the workload data;
    collecting memory connection data from a memory connection for the workload data; and
    collecting communication interconnect data from the communication interconnect.

11. The method of claim 9, wherein the workload data comprises at least one of a pending queue size, a number of stalls waiting for the communication interconnect, or a latency.

12. The method of claim 9, wherein the adjusting the operating frequency comprises adjusting the operating frequency during a change of frequency of one or more of the plurality of functional hardware units.

13. The method of claim 9, further comprising:
    comparing the workload metric against a first threshold and a second threshold;
    increasing the operating frequency when the workload metric exceeds the first threshold; and
    decreasing the operating frequency when the workload metric exceeds the second threshold.

14. The method of claim 9, wherein the adjusting the operating frequency comprises selecting one of a plurality of fixed frequencies to adjust the operating frequency.

15. A non-transitory, computer-readable storage medium comprising instructions that, when executed by a processor, cause the processor to:
    collect, by a power management unit (PMU), workload data from a plurality of functional hardware units coupled together via a communication interconnect;
    collect, by the PMU, system configuration information including power consumption metrics for the plurality of functional hardware units and current operating frequencies of the plurality of functional hardware units;
    determine, by the PMU, a workload metric from the workload data and the system configuration; and
    adjust, by the PMU, an operating frequency of the communication interconnect up or down in view of the workload metric, wherein to adjust the operating frequency comprises to change an input of a phase-locked loop (PLL) that sets the operating frequency of the communication interconnect.

16. The storage medium of claim 15, wherein to collect comprises to:
    collect core data from a plurality of processor cores for the workload data;
    collect cache element data from a cache element for the workload data;
    collect computation element data from a computation element for the workload data;
    collect memory connection data from a memory connection for the workload data; and
    collect communication interconnect data from the communication interconnect.

17. The storage medium of claim 15, wherein the workload data comprises at least one of a pending queue size, a number of stalls waiting for the communication interconnect, or a latency.

18. The storage medium of claim 15, wherein to adjust the operating frequency comprises to adjust the operating frequency during a change of frequency of one or more of the plurality of functional hardware units.

19. The storage medium of claim 15, wherein the instructions further cause the processor to:

compare the workload metric against a first threshold and a second threshold;
increase the operating frequency when the workload metric exceeds the first threshold; and
decrease the operating frequency when the workload metric exceeds the second threshold.

20. A system comprising:
an integrated circuit die comprising a plurality of functional hardware units, wherein the plurality of functional hardware units comprise at least two processor cores, at least two cache elements, a computation element, and a memory connection coupled together via a communication interconnect; and
a memory device coupled to the memory connection; wherein the integrated circuit die comprises a power management unit (PMU) to:
collect workload data from the plurality of functional hardware units;
collect system configuration information including power consumption metrics for the plurality of functional hardware units and current operating frequencies of the plurality of functional hardware units;
determine a workload metric from the workload data and the system configuration; and
adjust an operating frequency of the communication interconnect up or down in view of the workload metric; and
a phase-locked loop (PLL) coupled to the PMU, wherein the PLL is to receive an input from the PMU to set the operating frequency of the communication interconnect, and wherein the PMU is to adjust the operating frequency by changing the input of the PLL.

21. The system of claim 20, wherein the PMU is further to:
collect core data from the at least two processor cores for the workload data;
collect cache element data from the cache element for the workload data;
collect computation element data from the computation element for the workload data;
collect memory connection data from the memory connection for the workload data; and
collect communication interconnect data from the communication interconnect.

22. The system of claim 20, wherein the workload data comprises at least one of a pending queue size, a number of stalls waiting for the communication interconnect, or a latency, wherein the PMU is further to adjust the operating frequency of the communication interconnect during a change of frequency of one or more of the plurality of functional hardware units.

23. The system of claim 20, wherein the PMU is further to compare the workload metric against a first threshold and a second threshold, and wherein the PMU is further to increase the operating frequency when the workload metric exceeds the first threshold and to decrease the operating frequency when the workload metric exceeds the second threshold.

24. The system of claim 20, wherein the PMU is further to select one of a plurality of fixed frequencies to adjust the operating frequency.

25. The integrated circuit of claim 1, wherein the interconnect frequency controller is further to:
predict system performance in view of the workload metric at a plurality of operating frequencies; and
select the operating frequency from among the plurality of operating frequencies to moderate power consumption of the communication interconnect in view a predicted system performance at the operating frequency.

26. The method of claim 9, further comprising:
predicting system performance in view of the workload metric at a plurality of operating frequencies; and
selecting the operating frequency from among the plurality of operating frequencies to moderate power consumption of the communication interconnect in view a predicted system performance at the operating frequency.

27. The storage medium of claim 15, wherein the instructions further cause the processor to:
predict system performance in view of the workload metric at a plurality of operating frequencies; and
select the operating frequency from among the plurality of operating frequencies to moderate power consumption of the communication interconnect in view a predicted system performance at the operating frequency.

28. The system of claim 20, wherein the PMU is further to:
predict system performance in view of the workload metric at a plurality of operating frequencies; and
select the operating frequency from among the plurality of operating frequencies to moderate power consumption of the communication interconnect in view a predicted system performance at the operating frequency.

* * * * *